MULTIVIBRATOR FOR TELEVISION DEFLECTION CIRCUIT

Filed Nov. 21, 1960

WITNESSES

Leon J. Jaza

James F. Young

INVENTOR

Melbourne J. Hellstrom

BY

Benjamin DeWitt

ATTORNEY 3,170,072
MULTIVIBRATOR FOR TELEVISION DEFLECTION CIRCUIT

Melbourne J. Hellstrom, Watchung, N.J., assignor to Westinghouse Electric Corporation, East Pittsburgh, Pa., a corporation of Pennsylvania Filed Nov. 21, 1960, Ser. No. 70,567
1 Claim. (Cl. 307—88.5)

Figure 1:
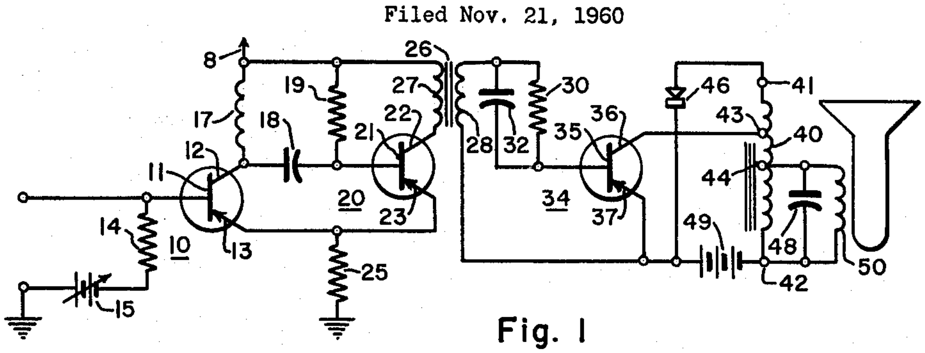

The present invention relates to semiconductor circuits and in particular to oscillator circuits utilizing transistors for control of beam deflection in cathode ray tubes as used, for example, in television receivers and monitors.

As is well known, sweep current waves for magnetic horizontal or line deflection in cathode ray deflection systems generally must have a sawtooth wave shape, including a trace portion and a retrace portion with the time duration of the retrace portion being an order of magnitude smaller than the duration of the trace portion. For example, the standard television system used in the United States operates on a line-scan frequency of approximately 15,750 cycles per second with the duration of the trace period being about 53 microseconds and the retrace period being about 10 microseconds. To provide the required waveform, many circuit arrangements employing both electron tubes and transistors have been devised heretofore. The relatively large amount of power consumed in conventional television sets for production of the horizontal deflection of the cathode ray has long been a problem, particularly when it is considered that the total useful work performed by the deflection system is substantially zero. It is well recognized that the power consumed by electronic apparatus, such as television receivers, for example, may be substantially reduced by using transistors and other semiconductor devices. In addition, the use of transistors contributes improved reliability of circuit operation and simplicity of the circuit connections and components used.

Attempts to use semiconductor devices to accomplish rapid switching at high current levels such as required in the horizontal deflection system of television cameras and receivers have encountered difficulty. Existing commercial power transistors in general have not been designed for the high speed switching required. They turn off more slowly than is desirable in the horizontal deflection application. It is not possible to terminate the collector current in a typical power transistor by merely reducing the forward base bias to zero. Attempting to cutoff the collector current in that manner commonly results in a cutoff time which is several times the permissible retrace time of the deflection circuit. It has been found that if the cutoff pulse applied to the base of the transistor is of sufficient amplitude to bias it in the reverse direction with respect to the emitter, a transient reverse base current will flow as stored minority carriers are removed from the base junction. By rapid removal of the minority carriers, it is possible to substantially reduce the collector current cutoff time. The cutoff time has been found to vary generally as an inverse function of the applied reverse base bias. The time period between initial application of a reverse bias to the base electrode and the completion of the collector current cutoff comprises two separate time periods, the first being the storage time during which the transistor remains saturated and continues to act like a closed switch, and the second being the cutoff time representing the interval during which the collector current decreases to zero.

The presently-known circuits for use as the deflection output stage using presently available power transistors have been found to require a reverse base pulse on the order of ten volts or more to achieve an adequately short cutoff time interval. Depending on the particular output transistor used, up to several amperes of reverse base current may flow during the cutoff process. The high reverse base current requires a correspondingly high output power from the horizontal oscillator circuits in order to achieve the desired cutofl time of the order of 3 microseconds or less.

Heretofore, the relatively large amount of drive power needed to make power transistors cutoff sufficiently fast has led to the use of an additional transistor amplifier stage between the horizontal oscillator and the horizontal output stage. The use of such an additional amplifier stage in the horizontal deflection system is, of course, undesirable in that it contributes to the expense of the system, complexity and power consumption while somewhat depreciating the overall reliability. The present invention avoids the foregoing difficulty by providing a novel transistor multivibrator circuit for use as the horizontal oscillator, which has a low impedance output circuit and which is capable of delivering substantial power to the directly-connected horizontal output stage during the interval in which the horizontal output transistor is to be cutoff. It is during this interval that the minority carriers must be removed from the base circuit of the horizontal output transistor as rapidly as possible in order to minimize the time required for cutoff. Other desirable characteristics of the multivibrator circuit of the present invention include simplicity of the circuit connections and components used and efficient and reliable circuit operation.

It is, accordingly, an object of the present invention to provide an improved multivibrator type relaxation oscillator employing semiconductor devices, such as transistors.

It is another object of the present invention to provide an improved self-oscillating semiconductor wave generator circuit which is reliable and efficient in operation.

It is a further object of the present invention to provide an improved cathode ray deflection circuit in which switching losses are minimized by using reactive energy for high speed removal of minority carriers from the control current path of a semiconductor device.

It is an additional object of the present invention to provide an improved semiconductor multivibrator circuit for cyclically switching a deflection output stage and capable of producing a large pulse of output current at a predetermnied time for effecting rapid removal of minority carriers from the control circuit of the output transistor.

It is a general object of the present invention to provide an improved multivibrator-type relaxation oscillator for controlling a transistor power output stage used in the horizontal deflection system of a cathode ray television apparatus.

The foregoing and other objects of the present invention are achieved by an asymmetrical astable multivibrator circuit which includes first and second transistors with the first transistor having an inductive load impedance and a capacitive coupling to the second transistor. The first transistor is initially biased to a saturation condition and current flows through the emitter-collector circuit to store energy in the inductive load impedance. When the first transistor is turned "off" the inductive load resonates with the capacitance coupled to the input circuit of the second transistor thereby providing a low impedance, high amplitude forward base current through the second transistor to render the same highly conductive. Accordingly, the second transistor is very rapidly switched to a low impedance condition and produces an output current pulse capable of rapidly exhausting minority carriers from the output stage power transistor which is driven thereby.

Figure 2:
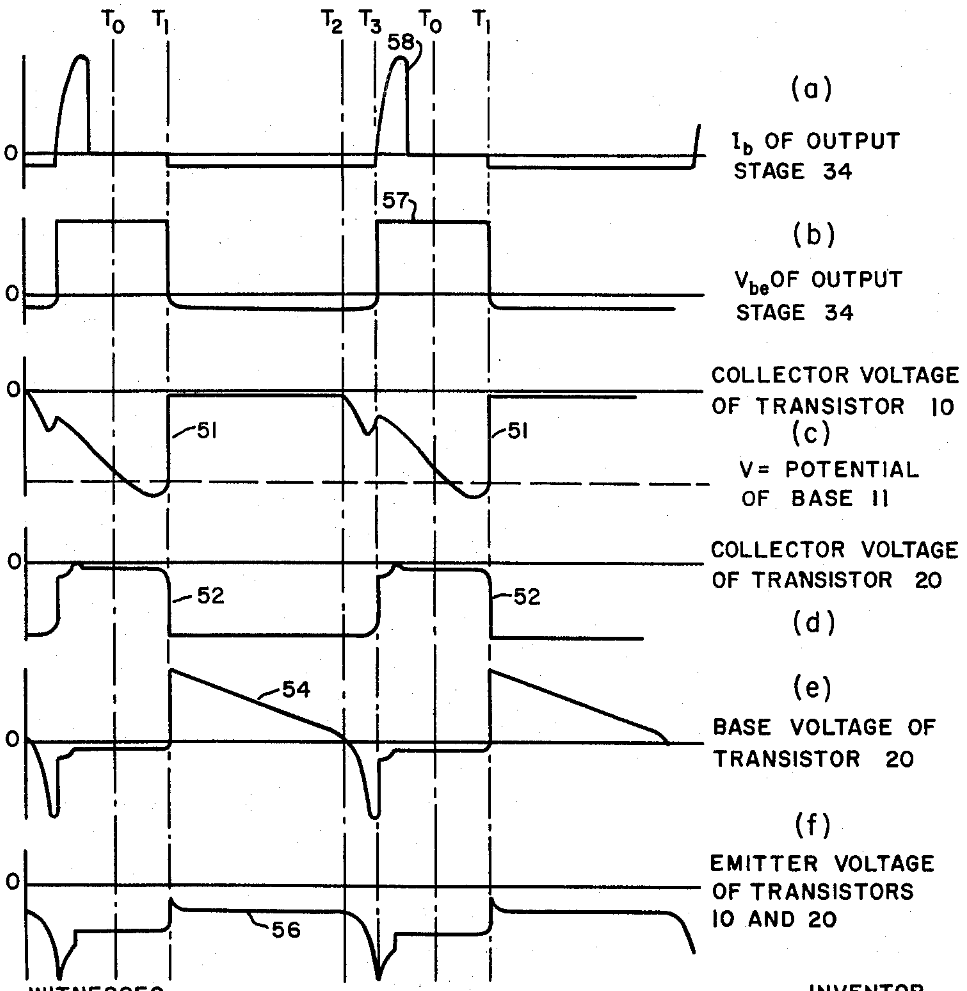

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

FIGURE 1 is a schematic circuit diagram of a semiconductor oscillator embodying the invention and connected to a transistor horizontal deflection output stage of a television receiver; and FIG. 2 is a plurality of graphs serving to illustrate the different voltage and current relationships in the circuitry of FIG. 1 during different time intervals throughout the cycle of operation.

As will be recognized by those skilled in the art, semiconductor devices 10 and 20 are connected to form an emitter-coupled multivibrator circuit. The emitters 13 and 23 are directly connected and a common emitter resistor 25 is connected from them to a point of reference potential shown as ground. Collector 12 of transistor 10 is connected to one end of an inductive load impedance 17 which has its other end connected to a point of operating potential shown as B—. The point of operating potential may be, in accordance with conventional practice, a battery or other source of direct current voltage. Accordingly, the point B— constitutes a source of operating potential connected serially with load impedance 17 and common emitter resistor 25 across the emitter-collector current path of transistor 10. The base electrode 11 of transistor 10 is connected to ground through a resistor 14 and a source of biasing potential 15. The source of biasing potential 15 is shown schematically as being a variable battery. However, in accordance with conventional practice, known to those skilled in the art, it may be any direct current frequency controlling potential source, such as that which is produced at the output of the phase detector or phase comparator circuit commonly used in present-day television receivers.

Coupling capacitor 18 is connected from the collector electrode of transistor 10 to the base electrode 21 of the second transistor 20. A resistor 19 is connected from the base electrode 21 to the point of energizing potential B— and forms with capacitor 18 an RC network whose function will be considered in detail hereinafter. The collector electrode of transistor 20 is connected through the primary winding 27 of an output transformer 26 to the source of operating potential B—. The secondary winding 28 of coupling transformer 26 has one end connected to the emitter electrode 37 of the horizontal output transistor stage 34. The upper end of secondary winding 28 is connected through a current limiting resistor 30 shunted by a capacitor 32 to the base electrode 35 of output transistor 34. The collector-emitter circuit of output transistor 34 is connected in conventional fashion to a flyback transformer 40. Flyback transformer 40 has first and second end terminals 41 and 42 and first and second intermediate terminals 43 and 44 with the first intermediate terminal 43 being connected to collector electrode 36, the first end terminal 41 being connected through a damper diode 46 to the emitter electrode 37, and with the second end terminals 42 being connected to the negative terminal of a source of energizing potential shown as battery 49. The positive terminal of the battery 49 is connected to the emitter electrode and to the cathode or negative terminal of the damper diode 46. The damper diode 46 may be any of various known unilaterally conductive devices, such as the thermionic damper tubes used in conventional television receivers or any one of various semiconductor rectifier devices. The second end terminal 42 and the second intermediate terminal 44 of flyback transformer 40 are connected to the respective end terminals of the horizontal deflection winding 50 of a cathode ray tube deflection yoke. The deflection yoke and winding 50 may be generally conventional, but preferably is designed to have a somewhat non-conventional inductance value as found most suitable for driving the same from the transistorized sawtooth wave generator. In that the deflection yoke is of conventional construction and the manner in which it is mounted on the neck of conventional cathode ray tubes is well known in the art, it is shown schematically. Persons skilled in the art will appreciate that the deflection winding 50 may comprise two serially connected portions arranged on opposite sides of the neck of a cathode ray television picture tube, so as to provide a magnetic deflection field within the tube. Further, it will be appreciated that intermediate terminal 44 may coincide with either terminal 41 or terminal 43, or may be connected to transformer 40 at some other intermediate point depending on the selected inductance of yoke winding 50. Deflection winding 50 is shunted by a capacitor 48, the value of which is selected to resonate the horizontal output circuit at a frequency such that one-half cycle at the resonant frequency is substantially equal to the permissible deflection retrace time interval.

The operation of the circuit shown in FIG. 1 is described with relation to FIG. 2 in which the various designated currents during one cycle of operation are represented as ordinants in the graphs (*a*), (*b*), (*c*), (*d*), (*e*) and (*f*). The abscissa in each of the graphs is time and the same time interval in each of the curves is correlated by the vertical lines to designate the time interval $T_1$–$T_2$; the time interval $T_2$–$T_3$; and the third time interval $T_3$–$T_1$. The vertical lines in FIG. 2 also serve to indicate the condition of the circuit shown in FIG. 1 during each time interval.

To fully appreciate the operation and advantages of the deflection system of the present invention, it is first desirable to have a full appreciation of the operation and requirements of the output stage comprising transistor 34 and flyback transformer 40. During the portion of the trace interval indicated by interval $T_1$–$T_3$ of FIG. 2, output transistor 34 is conductive so that the collector voltage with respect to the emitter is substantially zero and the total voltage of energizing source 49 is applied across terminals 42 and 43 of the flyback inductor 40. Accordingly, the collector current flowing through the inductor and in the yoke 50, builds up linearly and reaches a maximum value just prior to the time when transistor 34 is cutoff. At the time $T_3$ a positive voltage step must be applied to the base electrode 35 as shown by graph (*b*) in FIG. 2. When the transistor 34 is turned "off" the yoke 50 and its associated capacitances oscillate through a half cycle during the retrace period and a high amplitude retrace voltage pulse is applied to the collector via inductor 40. During the first portion $T_0$ to $T_1$ of the trace interval $T_3$, the voltage across flyback transformer 40 is such that the damper diode 46 is rendered conductive and energy stored in the yoke flows through the diode 46 back into the voltage source 49. Transistor 34 is non-conductive during this first portion of trace due to the positive pulse at its base.

To afford proper operation of the output stage and to avoid unnecessary and deleterious energy dissipation in transistor 34, it is necessary that transistor 34 should be completely cutoff or rendered non-conductive during the first portion of the retrace interval. As stated heretofore, existing commercial power transistors suitable for use as transistor 34 in the output stage generally do not have a short enough switching time. That is, the collector-emitter circuit tends to remain conductive for a significant time interval after application of the base bias pulse 57. Current flowing during that time interval, when the collector voltage is increasing, results in an appreciable power dissipation in the transistor. The transistor 34 cannot be cutoff by merely reducing the forward base bias to zero because the inherent cutoff time would result in an excessive waste of energy. This phenomena is described in an article in "Electronic Industries," August 1959, entitled "Horizontal Deflection Switching."

Increasing the reverse bias voltage of the base biasing pulse 57 is not satisfactory because if the cutoff pulse 57 applied to the base 35 is large enough in amplitude to appreciably reduce the cutoff time, it produces a transient reverse base current which tends to load down the output circuit of the multivibrator which is driving the base electrode 35. The transient reverse base current is caused by the rapid removal of stored minority carriers from the base layer of the power transistor. To achieve rapid removal of the minority carriers from the base of the output transistor 34, it is desirable to supply a base current having a waveform as shown by curve 58 in graph (*a*) of FIG. 2. As shown in graph (*a*) the base current of the output stage 34 includes a large pulse 58 during the time in which the base region is being cleared of minority carriers and then falls substantially to zero during the remainder of the period in which stage 34 is non-conductive. At the time $T_1$ forward bias is again applied to the base 35 as shown by graph (*b*) and forward current flows in the base-to-emitter circuit during the time interval $T_1$–$T_3$. The high amplitude reverse bias pulse 57 applied to base 35 during the flyback interval $T_3$–$T_0$ enables the output stage 34 to withstand high collector voltages and during the interval $T_0$–$T_1$ prevents the collector-base junction from becoming conductive prematurely, that is, while the diode 46 is carrying the initial part of the trace current. The large pulse 58 of reverse base current produced during the cutoff interval is caused by rapid removal of minority carriers from the base layer of transistor 34 in response to the large reverse bias pulse 57 applied to the base. It has been found that the required input voltage and current waveform as shown by graphs (*b*) and (*a*) respectively cannot be obtained from conventional blocking oscillators or multivibrators of the type which have heretofore been used in television deflection systems. To obtain the large pulse of reverse current at the beginning of the interval $T_3$–$T_1$, the output transistor of the driving multivibrator must be severely overdriven at its base electrode. To obtain such operation with conventional transistor multivibrator circuits would require changes in the magnitudes of the various circuit components, which changes would make it impossible to obtain the switching speeds and the cycle which is required and probably would result in considerable energy loss. The present invention overcomes the foregoing difficulty by providing the novel multivibrator circuit comprising first and second transistors 10 and 20 with the first transistor having an inductive load 17 and with an RC network including capacitor 18 and resistor 19 connected between the collector 12 of the first transistor and the base electrode 21 of the second transistor.

During time interval $T_1$–$T_2$ transistor 10 is fully conductive (in saturation) and current flows through resistor 25, the emitter-to-collector current path, and the inductor 17 to the energizing source B−, thereby storing energy in inductor 17. As the collector current of transistor 10 increases linearly, the votage drop across resistor 25 increases until the voltage of emitter 13 becomes substantially equal to the frequency control voltage applied to base 11 from control voltage source 15. That is, as the inductor 17 charging current increases during the time $T_2$–$T_2$, the voltage drop across resistor 25 gradually increases until emitter 13 finally reaches the voltage V of base electrode 11 as shown in graph (*c*). When the voltage of emitter 13 approaches the voltage of base 11, the decreased forward bias on base 11 causes the base current to decrease thereby bringing the collector circuit out of its low resistance (saturation) state and hence decreasing the collector current flow to inductor 17. At this time the inductor 17 is charged to a current level which is directly proportional to the control voltage supplied by source 15 and is inversely proportional to the magnitude of emitter resistor 25. The charging interval during which energy is stored in inductor 17 by the emitter collector current through transistor 10 is proportional to $LV/RE_b$. In the foregoing equation, L represents the inductance of the inductive load impedance 17, V represents the magnitude of the frequency control voltage supplied from source 15, R represents the value of emitter resistor 25, and $E_b$ represents the magnitude of the operating voltage B−.

When transistor 10 is brought out of saturation by the decreasing base-to-emitter forward bais, the collector current decreases, collector 12 goes in a negative direction, and capacitor 18 discharges through the base-emitter junction of transistor 20. The pulse of forward current at base 21 turns transistor 20 "on," so that collector current is drawn through resistor 25. The current flow through resistor 25 to transistor 20 drives emitter 13 more negative thereby reverse biasing the base of transistor 10 and switching transistor 10 to cutoff. Termination of collector current flow from collector 12 through inductor 17, results in application of an inductive pulse from inductor 17 through capacitor 18 to the base 21 of transistor 20. This inductive pulse applied to base electrode 21 is shown at 54 in graph (*e*) of FIG. 2. Thus, the circuit regeneratively switches to the state defined by transistor 10 being "off" and transistor 20 being "on" or fully conductive.

The duration of the time interval $T_1$–$T_2$, which is the "on" time of transistor 10, is determined primarily by the time constant $$T=\frac{L}{R}$$

of the collector current circuit, and by the relation of the control voltage from source 15 to the energizing voltage $E_b$ of source B−. Thus, the duration of the time interval $T_1$–$T_2$ may be controlled by varying the control voltage 15 applied to the base 11 and the frequency of the multivibrator may be thus controlled.

During the time interval $T_2$–$T_3$ an oscillation occurs involving inductor 17 and capacitor 18 and the base-to-emitter circuit of transistor 20. This oscillation, which terminates when the base current of transistor 20 approaches zero provides a large forward bias on the base of transistor 20 and provides a heavy base current so that transistor 20 is held highly conductive and is able to supply the large pulse of collector current 58 required to adequately drive the output stage 34. As shown by curve 54 in graph (*e*) the time constant of the RC network including capacitor 18 and resistor 19 should be adjusted so that capacitor 18 discharges through resistor 19 and reduces the reverse bias applied to base 21 to zero at about the same time that transistor 10 comes out of saturation. That is, the "on" time of transistor 10 is determined by the *L/R* time constant of inductor 17 and resistor 25. That "on" time is the time interval $T_1$–$T_2$ as shown in FIG. 2. The "off" time of transistor 20 also corresponds to the time interval $T_1$–$T_2$, and is determined by the RC time constant of the differentiating network 18 and 19. Desirably, capacitor 18 should discharge sufficiently to permit transistor 20 to conduct at about the same time that the transistor 10 comes out of saturation and begins to turn off. If the RC time of the differentiating network 18–19 does not have the proper relation to the *L/R* time constant of the inductor 17, the circuit of the present invention can "multimode," or generate subharmonics. For the purposes of the present invention, such undesirable mode of operation sohuld be avoided.

In the multivibrator circuit arrangement shown in FIG. 1, the basic frequency is largely determined by the rate at which the collector current of transistor 10 increases. That rate, of course, is determined by the *L/R* time constant of inductor 17 and emitter resistor 25. Automatic frequency control of the circuit of the present invention may be had by controlling the voltage V applied to base electrode 11 from source 15. Independent control of the time interval $T_1$–$T_2$ during which transistor 10 is conductive is available because the duration of that time interval is determined by the voltage V, the time constant $L/R_{25}$, and the RC time constant of the differentiating network 18–19. Likewise, independent control of the time interval $T_3$–$T_1$ during which transistor 20 is conductive is available because the duration of that time interval is dependent upon the resonant frequency of the inductor 17 and the capacitor 18 in the series circuit including the base-to-emitter diode of transistor 20.

While it will be understood that the circuit specifications of the multivibrator of the present invention may vary according to the design for any particular application, and while applicant does not intend to limit the invention to any particular design constants, the following values have been found suitable for a transistor multivibrator for the horizontal deflection system in a television receiver:

| | |
|---|---|
| Transistor **10**, Transistor **20** | Alloy junction audio power transistors. |
| Battery **15** | 1–2 volts. |
| Voltage source B— | 12 volts. |
| Resistor **25** | 2.7 ohms. |
| Resistor **19** | 2000 ohms. |
| Capacitor **18** | .05 mfd. |
| Inductor **17** | (Approximate) 2 mhy. |

There has been disclosed an improved multivibrator circuit utilizing junction transistors as the active circuit elements, capable of producing a high output current from a low impedance output circuit for driving the input circuit of a power transistor utilized in a horizontal deflection output stage. Use of the circuit of the present invention enables the use of known junction transistors as high speed switches for cathode ray deflection driving circuits. In addition, the present invention provides a general purpose multivibrator featuring great economy of circuitry and structure and employing transistors as the active elements.

While there has been described what is at present considered to be the preferred embodiment of this invention, it will be obvious to those skilled in the art that various changes and modifications may be made therein without departing from the spirit and scope thereof, and it is not limited to the particular embodiment disclosed.

It is aimed to cover all such changes and modifications as fall within the true spirit and scope of the invention.

I claim as my invention:

A deflection wave generator comprising in combination an asymmetrical astable emitter coupled multivibrator including first and second transistors, each having emitter, collector and base electrodes, said emitter electrodes being commonly connected, a point of reference potential, impedance means connected between said point and the commonly connected emitter electrodes to provide regenerative feedback between said second transistor to said first transistor, a source of operating potential connected at one end to said point, an inductive load impedance connected between said source and the collector electrode of said first transistor for storing reactive energy during intervals when said first transistor is conductive, a differentiation circuit comprised of a capacitor and a resistor connected in series in the order named between the collector of said first transistor and said source with the junction of said resistor and capacitor being connected to the base electrode of said second transistor, a reactive current pulse being applied from said load impedance to the base electrode of said second transistor when said first transistor is switched to its nonconductive state in response to the discharge of said capacitor so that the base electrode of said second transistor draws a substantially large base current to render the same highly and continuously conductive during periods immediately following cutoff of said first transistor until said first transistor is rendered conductive again, an output transformer connected between the collector electrode of said second transistor and said source of operating potential, means for applying a frequency controlling signal to the base electrode of said first transistor so that said multivibrator oscillates at a predetermined frequency to produce a substantially rectangular voltage waveform across said output transformer, and means coupled to said output transformer and responsive to said voltage waveform for applying a sawtooth waveform current to the deflection coils of a cathode ray tube.

References Cited in the file of this patent

UNITED STATES PATENTS

| | | |
|---|---|---|
| 2,423,304 | Fitch | July 1, 1947 |
| 2,946,899 | Day | July 26, 1960 |
| 2,952,784 | Carr | Sept. 13, 1960 |
| 2,992,640 | Knapp | July 18, 1961 |
| 3,041,470 | Woodworth | June 26, 1962 |
| 3,065,362 | Benson | Nov. 20, 1962 |